United States Patent
Mochizuki et al.

(10) Patent No.: US 8,030,127 B2
(45) Date of Patent: Oct. 4, 2011

(54) METHODS OF MAKING CARBON-CONTAINING SEMICONDUCTING DEVICES BY PYROLYZING A POLYMER INCLUDING ASPHALT OR PETROLEUM PITCH

(75) Inventors: Amane Mochizuki, San Diego, CA (US); Toshitaka Nakamura, Oceanside, CA (US); Masakatsu Urairi, Palo Alto, CA (US); Guang Pan, Carsbad, CA (US)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/753,395

(22) Filed: Apr. 2, 2010

(65) Prior Publication Data

US 2010/0221850 A1 Sep. 2, 2010

Related U.S. Application Data

(62) Division of application No. 12/035,990, filed on Feb. 22, 2008, now abandoned.

(60) Provisional application No. 60/902,979, filed on Feb. 22, 2007.

(51) Int. Cl.
*H01L 51/30* (2006.01)
*H01L 51/40* (2006.01)
*H01L 51/46* (2006.01)
*H01L 51/48* (2006.01)
*H01L 51/42* (2006.01)

(52) U.S. Cl. ........... 438/99; 257/40; 257/E51.012; 257/E51.017; 257/E51.024; 257/E51.028; 257/E51.038; 257/E51.046

(58) Field of Classification Search ............ 257/40; 438/99

See application file for complete search history.

(56) References Cited

U.S. PATENT DOCUMENTS

| 7,235,912 B2 | 6/2007 | Sung | |
|---|---|---|---|
| 2002/0085968 A1* | 7/2002 | Smalley et al. | 422/198 |
| 2002/0121915 A1* | 9/2002 | Montull et al. | 324/765 |
| 2003/0151107 A1* | 8/2003 | Yamada et al. | 257/431 |
| 2005/0167799 A1* | 8/2005 | Doan | 257/678 |
| 2008/0277652 A1 | 11/2008 | Michizuki et al. | |

FOREIGN PATENT DOCUMENTS

| JP | 03-062036 | 3/1991 |
|---|---|---|
| JP | 04-028856 | 1/1992 |
| JP | 2001-026873 | 1/2001 |

(Continued)

OTHER PUBLICATIONS

Anguita et al., "Semiconducting Hydrogenated Carbon-Nitrogen Alloys with Low Defect Densities," Diamond and Related Materials, vol. 9, No. 3, pp. 777-780(4) (Apr. 2000).

(Continued)

*Primary Examiner* — Ha Tran T Nguyen
*Assistant Examiner* — Raj R Gupta
(74) *Attorney, Agent, or Firm* — Knobbe Martens Olson & Bear LLP

(57) ABSTRACT

Embodiments of the present invention relate to semiconducting carbon-containing devices and methods of making thereof. The semi-conducting carbon containing devices comprise an n-type semiconducting layer and a p-type semiconducting layer, both of which are positioned over a substrate. The n-type semiconducting layer can be formed by pyrolyzing a carbon- and nitrogen-containing polymer, and the p-type semiconducting layer can be formed by pyrolyzing an aromatic- and aliphatic-group-containing polymer. In some embodiments, the devices are solar cell devices.

21 Claims, 5 Drawing Sheets

FOREIGN PATENT DOCUMENTS

| JP | 2002-033497 | | 1/2002 |
|---|---|---|---|
| JP | 2002-094097 | | 3/2002 |
| JP | 2002094097 A | * | 3/2002 |
| JP | 2003-209270 | | 7/2003 |

OTHER PUBLICATIONS

Feng et al., "Well-aligned polyaniline-carbon-nanotube composite films grown by in-situ aniline polymerization" Carbon, Elsevier, Oxford, GB, vol. 41, No. 8, Jan. 1, 2003, pp. 1551-1557.

Fu et al., "SiC films grown on silicon by pyrolysis of polymide Langmuir-Blodgett films containing dispersed silicon nanoparticles" Materials Letters, North Holland Publishing Company. Amsterdam, NL, vol. 37, No. 4-5, Nov. 1998, pp. 294-297.

Koltun et al., "Solar Cells from Carbon," Solar Energy Materials and Solar Cells, vol. 44, No. 4, pp. 485-491(7) (Dec. 15, 1996).

Krishna et al., "Photovoltaic and spectral photoresponse characteristics of $n$-C- $p$-C solar cell on a p-silicon substrate" Applied Physics Letter, vol. 77, pp. 1427-1429 (2000).

Krishna et al., Photovoltaic Solar Cell from Camphoric Carbon—A Natural Source, Solar Energy and Solar Cells 48 (1997) 25-33.

Krishnal et al., "Solar Cells Based on Carbon Thin Films," Solar Energy Materials and Solar Cells, vol. 65, No. 1, pp. 163-170(8) (Jan. 2001).

Kureishi et al., "Photoinduced Electron Transfer from Synthetic Chlorophyll Analogue to Fullerene C60 on Carbon Paste Electrode—Preparation of a Novel Solar Cell," Bioelectrochemistry and Bioenergetics, vol. 48, No. 1, pp. 95-100(6) (Feb. 1999).

Ma et al., "Boron-Doped Diamond-like Amorphous Carbon as Photovoltaic Films in Solar Cell," Solar Energy Materials and Solar Cells, vol. 69, No. 4, pp. 339-344(6) (Nov. 2001).

Maldei M., et al., "Quantum-Efficiency Measurements on Carbon-Hydrogen-Alloy-Based Solar Cells," Solar Energy Materials and Solar Cells, vol. 51, No. 3, pp. 433-440(8) (Feb. 27, 1998).

Narayanan et al., "Photovoltaic Effects of a :C-C60-Si (p-i-n) Solar Cell Structures," Solar Energy Materials and Solar Cells, vol. 75, No. 3, pp. 345-350(6) (Feb. 1, 2003).

Rusop et al., "Photoelectrical properties of pulsed laser deposited boron dropped p-carbon-n-silicon and phosphorus doped n-carbon-p-silicon heterojunction solar cells" Solar Energy, vol. 78 (2005) Pergamon Press. Oxford, GB, pp. 406-415.

Rusop et al., "Nitrogen Doped n-type Amorphous Carbon Films Obtained by Pulsed Laser Deposition with a Natural Camphor Source Target for Solar Cell Applications," Journal of Physics: Condensed Matter, vol. 17, No. 12, pp. 1929-1946(18) (Mar. 30, 2005).

Sharon, et al., "A Photoelectrochemical Solar Cell from Camphoric p-carbon Semiconductor," Solar Energy Materials and Solar Cells, vol. 45, No. 1, pp. 35-41(7) (Jan. 1, 1997).

Sharon, et al., "Effect of Pyrolyzing Time and Temperature on the Bandgap of Camphor-Pyrolyzed Semiconducting Carbon Films," Materials Chemistry and Physics, vol. 56, No. 3, pp. 284-288(5) (Oct. 15, 1998).

Yi et al., "Structural Characterizations and Electrical Properties of Pyrolyzed Polyimide Containing Silicon in the Main Chain," Synthetic Metals, vol. 126, No. 2, pp. 325-330(6) (Feb. 14, 2002).

Yu et al., "Photovoltaic cell of carbonaceous film-n-type silicon" Applied Physics Letters, AIP, American Institute of Physics, Melville, NY, vol. 68, No. 4, Jan. 22, 1996, pp. 547-549.

International Search Report dated Jun. 17, 2008 issued in the PCT/US2008/054787 application.

* cited by examiner

METHODS OF MAKING CARBON-CONTAINING SEMICONDUCTING DEVICES BY PYROLYZING A POLYMER INCLUDING ASPHALT OR PETROLEUM PITCH

CROSS-REFERENCE TO RELATED APPLICATIONS

This application is a divisional application of U.S. patent application Ser. No. 12/035,990, filed on Feb. 22, 2008, entitled "Carbon-Containing Semiconducting Devices and Methods of Making Thereof," now abandoned, which claims priority to U.S. Provisional Patent Application No. 60/902,979, filed on Feb. 22, 2007, entitled "Carbon-Containing Semiconducting Devices and Methods of Making Thereof," the contents of both applications are hereby incorporated by reference in their entirety.

BACKGROUND OF THE INVENTION

1. Field of the Invention

Embodiments of the present invention relate to semiconducting carbon-containing devices and methods of making thereof. Both n-type and p-type semiconductor layers can be derived from carbon-containing polymeric precursors and one or both semiconductor layers can be incorporated into a semiconductor.

2. Description of the Related Art

Solar cells are one of the most important new energy sources that have become available in the past several decades. Considerable effort has gone into solar cell development, and solar cells are currently being applied in the production of some consumer electronics such as hand-held calculators. While significant progress has been made in solar cell development, increased energy conversion efficiency and cost reductions would be desirable to make large area solar cells practical in an economic sense for wider use for houses, automobiles, and mobile communications.

Generally, solar cells involve p-n junctions where charge separation across the junction forms the basis for the current production. The p-n junctions are created by forming a p-type semiconducting layer and an n-type semiconducting layer. Previous work relating to solar cells has involved silicon based semiconductor materials. However, the use of carbon in solar cells has recently been investigated. As carbon-containing solar cells offer advantages such as reduced manufacturing costs, there is a need for further development of such devices.

The following references provide further background to the invention and are incorporated herein by reference in their entireties: Umeno et al., Applied Physics Letter, Vol. 77, p. 1427 (2000); Yi et al., "Structural Characterizations and Electrical Properties of Pyrolyzed Polyimide Containing Silicon in the Main Chain," Synthetic Metals, Volume 126, Number 2, pp. 325-330(6) (Feb. 14, 2002); Sharon, M., "Effect of Pyrolyzing Time and Temperature on the Bandgap of Camphor-Pyrolyzed Semiconducting Carbon Films," Materials Chemistry and Physics, Volume 56, Number 3, pp. 284-288 (5) (Oct. 15, 1998); Krishna, K. M., "Photovoltaic Solar Cell from Camphoric Carbon—A Natural Source," Fuel and Energy Abstracts, Volume 38, Number 6, pp. 415-415(1) (November 1997); Krishnal, K. M., "Solar Cells Based on Carbon Thin Films," Solar Energy Materials and Solar Cells, Volume 65, Number 1, pp. 163-170(8) (January 2001); Anguita, J. V., "Semiconducting Hydrogenated Carbon-Nitrogen Alloys with Low Defect Densities," Diamond and Related Materials, Volume 9, Number 3, pp. 777-780(4) (April 2000); Narayanan et al., "Photovoltaic Effects of a: C/C60/Si (p-i-n) Solar Cell Structures," Solar Energy Materials and Solar Cells, Volume 75, Number 3, pp. 345-350(6) (Feb. 1, 2003); Rusop, M., "Nitrogen Doped n-type Amorphous Carbon Films Obtained by Pulsed Laser Deposition with a Natural Camphor Source Target for Solar Cell Applications," Journal of Physics: Condensed Matter, Volume 17, Number 12, pp. 1929-1946(18) (Mar. 30, 2005); Ma, Z. Q., "Boron-Doped Diamond-like Amorphous Carbon as Photovoltaic Films in Solar Cell," Solar Energy Materials and Solar Cells, Volume 69, Number 4, pp. 339-344(6) (November 2001); Krishnal, K. M., "Solar Cells Based on Carbon Thin Films," Solar Energy Materials and Solar Cells, Volume 65, Number 1, pp. 163-170(8) (January 2001); Kureishi, Y., "Photoinduced Electron Transfer from Synthetic Chlorophyll Analogue to Fullerene C60 on Carbon Paste Electrode—Preparation of a Novel Solar Cell," Bioelectrochemistry and Bioenergetics, Volume 48, Number 1, pp. 95-100(6) (February 1999); Maldei M., "Quantum-Efficiency Measurements on Carbon-Hydrogen-Alloy-Based Solar Cells," Solar Energy Materials and Solar Cells, Volume 51, Number 3, pp. 433-440(8) (Feb. 27, 1998); Sharon M., "A Photoelectrochemical Solar Cell from Camphoric p-carbon Semiconductor," Solar Energy Materials and Solar Cells, Volume 45, Number 1, pp. 35-41(7) (Jan. 1, 1997); and Faiman, D., "Solar Cells from Carbon," Solar Energy Materials and Solar Cells, Volume 44, Number 4, pp. 485-491(7) (Dec. 15, 1996).

The following patent applications and publications provide further background to the invention and are incorporated herein by reference in their entireties: Japanese Patent Application Number 2000-281411, filed on Sep. 18, 2000, entitled "Carbon Material for Solar Cell and Solar Cell," which published on Mar. 29, 2002 as JP 2002-94097 A; Japanese Patent Application Number H11-198674, filed Jul. 13, 1999, entitled "Film Forming Device of Hard Carbon Film," which published Jan. 30, 2001 as JP 2001-026873; Japanese Patent Application Number H02-134810, filed on May 24, 1990, entitled "Ion Source and Diamond Like Carbon Thin Film Forming Device Provided with the Same," which published on Jan. 31, 1992 as JP 04-028856; Japanese Patent Application Number 2000-214258, filed on Jul. 14, 2000, entitled "Solar Cell and Panel Thereof," which published on Jan. 31, 2002 as JP 2002-33497 A; Japanese Patent Application Number 2000-281411, filed on Sep. 18, 2000, entitled "Carbon Material for Solar Cell and Solar Cell," which published on Mar. 29, 2002 as JP 2002-94097 A; Japanese Patent Application Number 2002-6031, filed on Jan. 15, 2002, entitled "Carbon Photoelectric Element and Its Manufacturing Method," which published on Jul. 25, 2003 as JP 2003-209270 A; and U.S. Patent Application Publication Number US 2005/0275330, entitled "Diamond-like Carbon Thermoelectric Conversion Devices and Methods for the Use and Manufacture Thereof."

SUMMARY OF THE INVENTION

Described herein are methods of manufacturing a semiconducting device. In an embodiment, the method comprises forming a first polymer layer over a substrate, forming a second polymer layer over the substrate, pyrolyzing the first polymer layer under substantially nonoxidizing conditions to transform the first polymer layer into an n-type semiconducting layer, and pyrolyzing the second polymer layer under substantially nonoxidizing conditions to transform the second polymer layer into a p-type semiconducting layer. In an embodiment, the first polymer layer comprises nitrogen and carbon. In an embodiment, the second polymer layer comprises aromatic and aliphatic functional groups.

The order and positioning of forming the first and second layers can vary. For example, the first layer can be formed over the second layer or the second layer can be formed over the first layer. Additionally, the order of pyrolyzing the first and second polymer layers into respective n-type and p-type semiconducting layers can also vary. In an embodiment, the first polymer layer is pyrolyzed before the second polymer layer is pyrolyzed. In an embodiment, the second polymer layer is pyrolyzed before the first polymer layer is pyrolyzed. In an embodiment, the first and second polymer layers are pyrolyzed during the course of the same pyrolyzation processing step.

Described herein are semiconductor devices. In an embodiment, the semiconductor device is manufactured according to the methods described herein. In an embodiment, the semiconductor device comprises a substrate, an n-type semiconducting layer positioned over the substrate, and a p-type semiconducting layer positioned over the substrate. In an embodiment, the n-type semiconducting layer comprises a pyrolyzed carbon- and nitrogen-containing polymer. In an embodiment, the p-type semiconducting layer comprises a pyrolyzed aromatic- and aliphatic-group-containing polymer. Either the n-type semiconducting layer is formed over the p-type semiconducting layer or the p-type semiconducting layer is formed over the n-type semiconducting layer.

An embodiment provides a semiconducting device that comprises a substrate, an n-type semiconducting layer positioned over the substrate, wherein the n-type semiconducting layer comprises (i) a pyrolyzed carbon- and nitrogen-containing polymer or (ii) a pyrolyzed aromatic- and aliphatic-group-containing polymer, and a p-type semiconducting layer positioned over the substrate, wherein the p-type semiconducting layer comprises (i) a pyrolyzed carbon- and nitrogen-containing polymer or (ii) a pyrolyzed aromatic- and aliphatic-group-containing polymer. In an embodiment, the n-type semiconducting layer comprises nitrogen and carbon. In an embodiment, the p-type semiconducting layer comprises aromatic and aliphatic functional groups An embodiment described herein provides a method of manufacturing a semiconducting device that comprises forming a first polymer layer over a substrate, wherein the first polymer layer comprises (i) nitrogen and carbon or (ii) aromatic and aliphatic functional groups and forming a second polymer layer over the substrate, wherein the second polymer layer comprises (i) nitrogen and carbon or (ii) aromatic and aliphatic functional groups.

In an embodiment, one of the first or second polymer layers is pyrolyzed under substantially nonoxidizing conditions sufficient to transform the first or second polymer layer into a p-type semiconducting layer. In an embodiment, the other polymer is pyrolyzed under substantially nonoxidizing conditions sufficient to transform the other polymer layer into an n-type semiconducting layer. In an embodiment, the first polymer layer comprises nitrogen and carbon. In an embodiment, the second polymer layer comprises aromatic and aliphatic functional groups. Further described herein are semiconducting devices made according to the any of the described methods.

In an embodiment, after forming the first and second polymer layers that comprise either (i) nitrogen and carbon or (ii) aromatic and aliphatic functional groups, the method comprises pyrolyzing the first polymer layer under substantially nonoxidizing conditions, and measuring to confirm that the first polymer layer is either is an n-type or p-type carrier. In an embodiment, the second polymer is pyrolyzed under substantially nonoxidizing conditions and then measured to confirm that the second polymer layer is a carrier type that is different than the carrier type of the first polymer layer.

Further described herein are semiconducting devices made according to the any of the described methods.

Also described herein are semiconducting layers. In an embodiment, an n-type semiconducting layer is made by a process that comprises pyrolyzing a polymer layer, wherein the polymer layer comprises nitrogen and carbon. In an embodiment, a p-type semiconducting layer is made by a process that comprises pyrolyzing a polymer layer, wherein the polymer layer comprises aromatic and aliphatic functional groups. In an embodiment, an n-type silicon semiconducting layer is combined with a pyrolyzed carbon-containing p-type semiconducting layer. In an embodiment, a p-type silicon semiconducting layer is combined with a pyrolyzed carbon-containing n-type semiconducting layer.

DETAILED DESCRIPTION OF THE PREFERRED EMBODIMENTS

Figure 1:
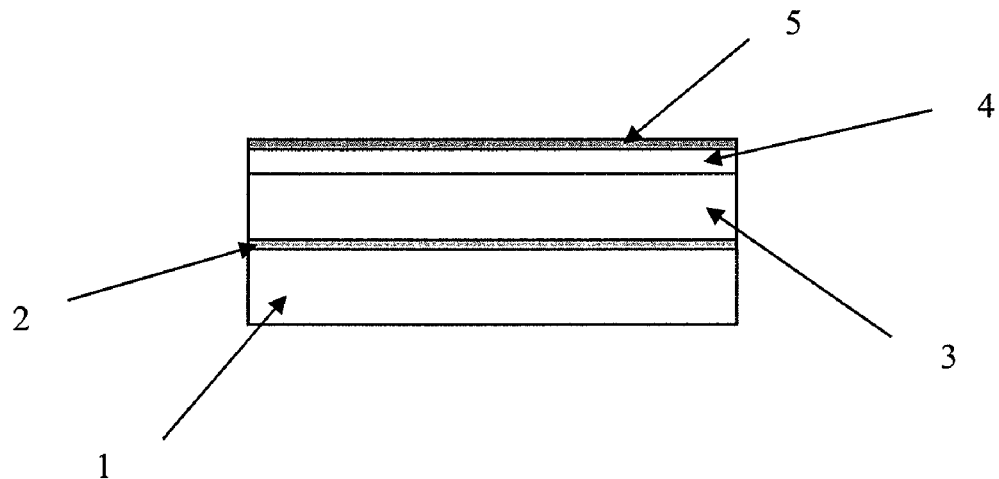
FIG. 1 illustrates a cross-section of an embodiment of a semiconducting device described herein.

In some embodiments, the present invention relates to a method of manufacturing a semiconducting carbon material, comprising pyrolyzing one or more polymeric precursor materials under non-oxidizing conditions. For example, the method of manufacturing a semiconducting carbon material can comprise pyrolyzing a single polymeric precursor. Additionally, the method of manufacturing a semiconducting carbon material can comprise pyrolyzing two different polymeric precursors. The pyrolyzation of two different polymeric precursors can be performed in a single processing step or in multiple processing steps.

In an embodiment, the method of manufacturing a semiconducting device comprises forming a first polymer layer over a substrate, wherein the first polymer layer comprises nitrogen and carbon; forming a second polymer layer over the substrate, wherein the second polymer layer comprises aromatic and aliphatic functional groups; pyrolyzing the first polymer layer under substantially nonoxidizing conditions selected to transform the first polymer layer into an n-type semiconducting layer; and pyrolyzing the second polymer layer under substantially nonoxidizing conditions selected to transform the second polymer layer into a p-type semiconducting layer. In an embodiment, the step of pyrolyzing the first polymer layer and the step of pyrolyzing the second polymer layer comprise a single processing step. In an embodiment, the pyrolyzation of n-type semiconducting layer is performed separately from the pyrolyzation of the p-type semiconducting layer.

The polymer precursor layers, after pyrolyzation, become semiconductor layers in a semiconducting device. In an embodiment, the first polymer layer is formed over the second polymer layer. In an embodiment, the second polymer layer is formed over the first polymer layer. The first and second polymeric layers may be adjacent one another or can have one or more layers between them. If the first and second polymeric layers are adjacent one another, the resulting n-type semiconducting layer is in contact with the p-type semiconducting layer after pyrolyzation of both first and second polymeric precursor layers.

Various types of polymer precursors can be used to form the first and second polymer layers, which are then pyrolyzed to form n-type and p-type, respectively, semiconducting layers. In an embodiment, the polymeric precursors comprise an aromatic group. In an embodiment, the polymeric precursors comprise an aliphatic group. In an embodiment, the polymeric precursor comprises both an aromatic and an aliphatic group. The term "aliphatic group" means a saturated or unsaturated linear or branched hydrocarbon group. An aliphatic group encompasses, for example, straight or branched alkyl, alkenyl, and alkynyl groups, and also includes alicyclic rings. The term "aromatic group" means a mono- or polynuclear aromatic hydrocarbon group. Suitable aromatic groups include, but are not limited to, phenyl, biphenyl, naphthyl, anthracenyl, phenanthrenyl, pyrenyl, quinolinyl, tetracenyl, and pentacenyl groups. Heteroatom(s), such as oxygen, nitrogen, and sulfur, can be present in both of the aliphatic groups or aromatic groups.

Various types of polymeric precursors can be used to form either the first polymer layer or the second polymer layer. For example, the polymeric precursor can comprise asphalts or petroleum pitch precursors. In an embodiment, asphalt or petroleum pitch precursor is used in the second polymer layer and is pyrolized into a p-type semiconductor layer. In an embodiment, asphalt or petroleum pitch precursor is used in the first polymer layer and is pyrolyzed into an n-type semiconductor layer.

Other useful polymeric precursors include polymers that comprise nitrogen. In an embodiment, the nitrogen-containing polymer precursor is used in the first polymer layer and is pyrolized into an n-type semiconductor layer. In an embodiment, the nitrogen-containing polymer precursor is used in the second polymer layer and is pyrolyzed into a p-type semiconductor layer. In an embodiment, the nitrogen-containing polymer comprises an aromatic group that comprises nitrogen. Examples of useful nitrogen-containing polymers include, but are not limited to polyimides, polyacrylonitriles, polyamides, polyamidimides, or combinations or copolymers thereof. In an embodiment, the nitrogen-containing polymer is a polyimide.

In some embodiments, the first and/or second polymer layer comprises two or more different polymeric precursors. For example, the first and/or second polymer layer can comprise two or more different types of asphalt and/or petroleum pitch. The first and/or second polymer layer can also comprise two or more different types of nitrogen-containing polymers. Furthermore, the first and/or second polymer layer can comprise two or more different types selected from the group consisting of asphalts, petroleum pitches, and nitrogen-containing polymers. In these embodiments, the polymeric precursors may vary in the ratio of sp2 to sp3 hybridization.

Semiconducting devices and/or semiconducting films described herein can be formed on or over a substrate. Any substrate that is typically used in semiconductor applications is useful. In an embodiment, the substrate comprises glass. In an embodiment, the substrate is selected from silica, quartz, fused silica, a fused quartz, or a borosilicate glass. In an embodiment, the substrate is a quartz or a fused silica substrate. Additional materials can also be used to form the substrate. For example, the substrate may comprise ceramics or a metal. The substrates can be cleaned as part of the process of forming the semiconducting devices and/or semiconducting films described herein. Any suitable cleaning agent may be used. For example, the substrate can be cleaned using deionized water, acetone, and/or isopropanol.

The polymeric precursors as described herein can be used to form the first and second polymer layers as precursor films, which are later pyrolyzed to form semiconducting layers. The polymeric precursors can first be diluted to a lower viscosity and/or filtered before being formed into a film. Various types of solvents can be used to dilute the precursor. For example, solvent extraction of asphalt and pitch can be performed using solvents such as toluene, hexane, xylene, benzene, dioxane, chloroform, n-pentane, n-heptane, naphthalene, tetrahydrofuran, trichloroethelene, n-propyl bromide, d-limonene, etc.

Various processes can be used to form the polymer films from the polymer precursor. Examples of film formation processing include the wet processes. In an embodiment, the wet process comprises spin coating. The spinning rates used while depositing the film can vary depending on, for example, the viscosity of the solution or the desired thickness of the film. In some embodiments, spinning rates range from about 1000 rpm to about 5000 rpm. In an embodiment, the spinning rate ranges from 1000 rpm to 2000 rpm. In an embodiment, the spinning rate ranges from 2000 rpm to 3000 rpm. In an embodiment, the spinning rate ranges from 3000 rpm to 4000 rpm. In an embodiment, the spinning rate ranges from 4000 rpm to 5000 rpm.

Other wet process coating methods are known in the art, and one having ordinary skill in the art, guided by the disclosure herein, is capable of utilizing these wet process coating methods. In an embodiment, the wet process of film formation comprises dip coating. In an embodiment, the wet process comprises flow coating. In an embodiment, the wet process comprises roller coating. In an embodiment, the wet process comprises spray coating. Additionally, combinations of these coating methods can be used to provide a desired coating thickness.

After the polymeric precursor is coated onto the substrate using a wet process, it can be cured into a film using a curing step. The curing step can take place in either an ambient or controlled environment to form a polymer film. The temperature and duration of curing can also be appropriately varied. In an embodiment, the temperature of the curing is at about 50° C. to about 1000° C. In an embodiment, the temperature of the curing is at about 100° C. to about 400° C. In an embodiment, the duration of the curing is at about 5 minutes to about 600 minutes. In an embodiment, the duration of the curing is at about 15 minutes to about 100 minutes. The curing step can also comprise curing at multiple temperatures, with each temperature stage having its own duration. For example, the curing may comprise curing films at one temperature and then curing the same films at another temperature, preferably a higher temperature. The temperature at each curing stage may increase or decrease along each step of the curing process.

Other film formation steps are contemplated for use in the methods described herein. In an embodiment, the polymeric film is formed using a chemical-vapor deposition (CVD) method. In an embodiment, the polymeric film is formed using a plasma-enhanced CVD (PECVD) method. In an embodiment, the polymeric film is formed using a vacuum evaporation method. In an embodiment, the polymeric film is formed using an e-beam evaporation method.

The precursor polymeric films described herein can be formed into a semiconducting layer upon pyrolysis. For example, the polymeric films can be pyrolyzed into either a p-type or an n-type semiconducting layer, depending on several factors, including the starting material used in the precursor, the temperature at which the pyrolysis takes place, and the duration of pyrolysis. For example, nitrogen-containing polymer precursors are more likely to produce an n-type semiconductor and asphalt and/or pitch precursors are more likely to produce a p-type semiconductor. In some embodiments, either of the aforementioned types of polymer precursors can be used to form either the n-type or p-type semiconductor. For example, pyrolysis conditions using low temperature and short duration can produce p-type semiconducting layers. Also, using relatively higher temperatures and longer pyrolysis durations can produce n-type semiconductors. Thus, one of ordinary skill in the art, guided by the disclosure herein, can produce either an n-type or p-type semiconductor from any of the polymeric precursors described herein by adjusting pyrolysis temperature, duration, and atmosphere.

The conditions under which the polymer precursors are pyrolyzed to produce a p-type carrier or an n-type carrier can vary for each of the described precursors, as will be understood by those skilled in the art in view of the teachings herein. For example, while aromatic- and aliphatic-containing polymeric precursors are likely to form a p-type carrier, such precursors, such as asphalt, can form n-type carriers when the pyrolysis temperature is 800° C. or above for a duration of about 10 hours. The asphalt precursor is even more likely to form an n-type carrier when the pyrolysis temperature is 900° C. or above for a duration of about 10 hours.

Additionally, nitrogen-containing polymers, such as polyimide and polyacrylonitrile, are likely to form n-type carriers under lower temperatures and lower duration of pyrolysis, as will be understood by those skilled in the art in view of the teachings herein. For example, polyimide is likely to form a p-type carrier under pyrolysis at temperatures ranging from about 700° C. to about 800° C. or higher under pyrolysis duration of about 1 hour, which are lower temperatures and durations than the asphalt described above. Thus, precursor material, temperature of pyrolysis, and duration of pyrolysis are all factors in determining whether a precursor becomes an n-type and p-type carrier. One having ordinary skill in the art can determine the carrier type after pyrolysis by measuring the Hall effect on the semiconductor layer using methods known in the art.

The pyrolysis process can be performed at varying temperature ranges. The degree of graphitization can be affected by selecting the pyrolysis temperature. If the pyrolysis temperature is too low, the carbon layer may be too akin to diamond to act as a semiconductor. If the pyrolysis temperature is too high, the carbon layer may be too akin to graphite to act as a semiconductor. In an embodiment, the temperature during pyrolysis is from about 400° C. to about 1000° C. In an embodiment, the temperature during pyrolysis is from about 400° C. to about 700° C. In an embodiment, the temperature during pyrolysis is from about 700° C. to about 1000° C. In an embodiment, the temperature during pyrolysis is from about 300° C. to about 400° C. In an embodiment, the temperature during pyrolysis is from about 400° C. to about 500° C. In an embodiment, the temperature during pyrolysis is from about 500° C. to about 600° C. In an embodiment, the temperature during pyrolysis is from about 600° C. to about 700° C. In an embodiment, the temperature during pyrolysis is from about 700° C. to about 800° C. In an embodiment, the temperature during pyrolysis is from about 800° C. to about 900° C. In an embodiment, the temperature during pyrolysis is from about 900° C. to about 1000° C.

The temperature of pyrolysis can remain constant or be varied. In some embodiments, the temperature is gradually increased during pyrolysis. For example, the temperature may be increased at a rate of about 1° C. per minute. In an embodiment, the temperature is increased at a rate of about 5° C. per minute. In an embodiment, the temperature is increased at a rate of about 10° C. per minute. In an embodiment, the temperature is increased at a rate of about 20° C. per minute. In an embodiment, the temperature is increased at a rate of about 30° C. per minute. In an embodiment, the temperature is increased at a rate of about 50° C. per minute. The temperature can be raised at any rate, but generally, the highest temperature attained during pyrolysis is from about 400° C. to about 1000° C. As previously noted, pyrolysis temperature, duration, and/or environments at least partially determine the sp2 and sp3 hybridization in the precursor film, along with the precursor starting material.

As previously noted, the first and second polymer layers can be n-type or p-type carriers when the first polymer layer comprises (i) nitrogen and carbon or (ii) aromatic and aliphatic functional groups and when the second polymer layer comprises (i) nitrogen and carbon or (ii) aromatic and aliphatic functional groups. After pyrolyzing in substantially nonoxidizing conditions sufficient to transform the polymeric layers into n-type or p-type semiconducting devices, Hall effect measurements known in the art can be employed that confirm that the first polymer layer is either is an n-type or p-type carrier and also confirm that the second polymer layer is a carrier type that is different than the carrier type of the first polymer layer.

In an embodiment, the environment during pyrolysis is controlled to avoid burn out of the polymeric films by oxidation. One manner of preventing oxidation is by conducting the pyrolysis under nonoxidizing conditions. For example, pyrolysis can be performed by one or more of pyrolyzing in a vacuum, pyrolyzing in an inert gas, pyrolyzing in a reducing gas, or pyrolyzing in a mixture of inert and reducing gas. Examples of suitable inert and reducing gas atmospheres for the pyrolysis step include, but are not limited to, argon, helium, nitrogen, ammonia, methane, carbon monoxide, carbon dioxide, hydrogen and hydrogen/diborane mixtures. As further discussed below, the atmosphere chosen can be an additional influence on the nature of the semiconducting materials, e.g. n-type or p-type.

The pyrolysis atmosphere affects the semiconducting properties of carbon films. It has been known in amorphous silicon solar cells that hydrogen will reduce the defects, especially, the interband gap defect by acting as a carrier trap, e.g. by terminating a dangling bond having an unpaired electron and forming a Si—H bond. As a result, the performance of solar cells can be significantly improved. While the process has been used in thin film type solar cells comprising amorphous silicon, semiconducting carbon films prepared by pyrolyzing polymeric precursors in hydrogen in the concentration range of 0.01 to 100% exhibited similar performance. In comparison with those pyrolyzed in inert atmosphere such as nitrogen, or vacuum, carbon films showed wider band gap, sharp absorption edge, and disappearance of the so called Urbach tail in the spectra, indicating an elimination of interband defects. In addition to pure hydrogen, mixture of hydrogen with other inert gases can also be used.

In some embodiments, pyrolysis is performed in a vacuum. Vacuum conditions can vary. In an embodiment, the vacuum is less than about 1 Pa. In an embodiment, the vacuum is less than about 0.5 Pa. In an embodiment, the vacuum is less than about 0.1 Pa. In an embodiment, the vacuum is less than about 0.005 Pa. In an embodiment, the vacuum is less than about 0.001 Pa. In an embodiment, the vacuum is less than about 0.0001 Pa. In an embodiment, the vacuum is about 0 Pa. The atmospheric vacuum can be created using several steps. For example, the pressure may be gradually reduced in multiple steps. In some embodiments, the environment may be purged with nitrogen or another inert gas prior to pyrolysis, which may occur between vacuuming steps. Purging the environment with an inert or reducing gas while producing the vacuum atmosphere can further remove air from the pyrolysis environment.

The substrate can comprise a first electrode layer, which can be between the substrate and the first polymeric layer formed thereon. For example, prior to forming the first polymer layer over the substrate, a first electrode layer can be formed over the substrate. In an embodiment, the first electrode layer is formed directly on the substrate. Any suitable technique can be used for forming the electrode. In an embodiment, the first electrode layer is a coating on the substrate. Various types of electrode materials can be used. For example, the first electrode layer can comprise molybdenum, tungsten, tantalum, or titanium. In an embodiment, the first electrode layer comprises molybdenum. Other metals can also be used to form the first electrode. In an embodiment, the first electrode layer comprises aluminum, copper, and/or stainless steel. Additional layers, other than the first polymer layer, can also be formed over the first electrode layer. In an embodiment, the first electrode layer acts as a support for one or more subsequent layers formed thereon.

The semi-conducting device can comprise a second electrode layer that can be applied over the second polymeric film layer. The second electrode layer can be formed on the device before or after pyrolysis of the second polymeric layer into a p-type semiconductor, and any suitable electrode material can be used. In an embodiment, the second electrode comprises a transparent conductive electrode layer. In an embodiment, the transparent conductive electrode layer comprises indium tin oxide.

FIG. 1 illustrates a cross-section of an embodiment of a semiconducting device described herein. A first polymer layer 3 is formed over a substrate 1. The substrate 1, as described herein, may be coated with a layer, such as a molybdenum layer or an aluminum layer, which can act as a bottom electrode layer 2. In an embodiment, the first polymer layer 3 is not a semiconducting layer at this point in the process, but rather can be a film that will be transformed into a semiconducting film by the end of the manufacturing process, e.g., after being pyrolyzed as described herein. In an embodiment, the first polymer layer 3 can be a polyimide precursor film, and can be formed as described herein. In some embodiments, a technique—such as a masking technique—is used such that the first polymer layer 3 is formed only over a portion of the substrate.

In some embodiments, an n-type-pyrolysis process is performed at this process step to convert the first polymer layer 3 to an n-type semiconducting layer. Conditions that are favorable in creating a semiconducting layer having an n-type include forming a nitrogen-containing polymer precursor, using lower temperature and duration pyrolysis, and combinations thereof. Not all of the conditions, however, are necessary to create␣␣␣␣␣␣␣␣␣␣␣␣␣␣␣␣an n-type semiconductor. In an embodiment, the pyrolysis of the first polymer layer takes place before a second polymer layer is formed. In an embodiment, the pyrolysis of the first polymer layer takes place after a second polymer layer is formed.

Before or after pyrolysis of the first polymer layer 3, a second polymer layer 4 is formed over the substrate, e.g., the second polymer layer 4 may be formed over the first polymer layer 3 by, for example, a method disclosed herein. In an embodiment, the second polymer layer 4 is not a semiconducting layer at this point in the process, but may be a film that will be transformed into a semiconducting layer by the end of the manufacturing process, e.g., after being pyrolyzed as described herein. In an embodiment, the second polymer layer 4 comprises asphalt or a petroleum pitch precursor.

In some embodiments, a p-type-pyrolysis process is performed at this step to convert the second polymer layer 4 to a p-type semiconducting layer. Conditions that are favorable in creating a semiconducting layer having a p-type include forming a aliphatic- and aromatic-containing polymer precursor, using higher temperature and duration pyrolysis, and combinations thereof. Not all of the conditions, however, are necessary to create a p-type semiconductor. The p-type pyrolysis process can be performed in the same embodiments that include the n-type pyrolysis process.

In some embodiments, a heterojunction-pyrolysis process can be performed at the pyrolysis step to form heterojunctions, e.g., a p-n junction. In some embodiments, the heterojunction pyrolysis process is performed when neither the n-type-pyrolysis process nor the p-type-pyrolysis process are performed.

A conductive transparent electrode layer 5 can be formed over the second polymer layer 4 or, after pyrolysis of the polymer layer 4, over the semiconducting layer formed thereafter. The conductive transparent electrode 5 layer can comprise any of the previously discussed electrode material. In an embodiment, the conductive transparent electrode comprises indium tin oxide (ITO). In an embodiment, the conductive transparent layer comprises gold.

The conductive transparent layer 5 can be formed by, for example, spin-coating, dip-coating, printing, vacuum deposition or sputtering methods. The conductive transparent layer 5 can be patterned and etched (see FIG. 2) or may be a continuous layer (see FIG. 3). In an embodiment, the conductive transparent layer 5 has a maximum transmittance of about 90% at a thickness of about 65 nm in the wavelength range of 300 nm to 2400 nm. The conductive transparent layer 5 can have a 600'Ω electrical resistance as measured over a span of 1 cm and a layer thickness of 318 nm. In some embodiments, the conductive transparent layer 5 comprises carbon nanotubes dispersed in one or more polymers.

Figure 2:
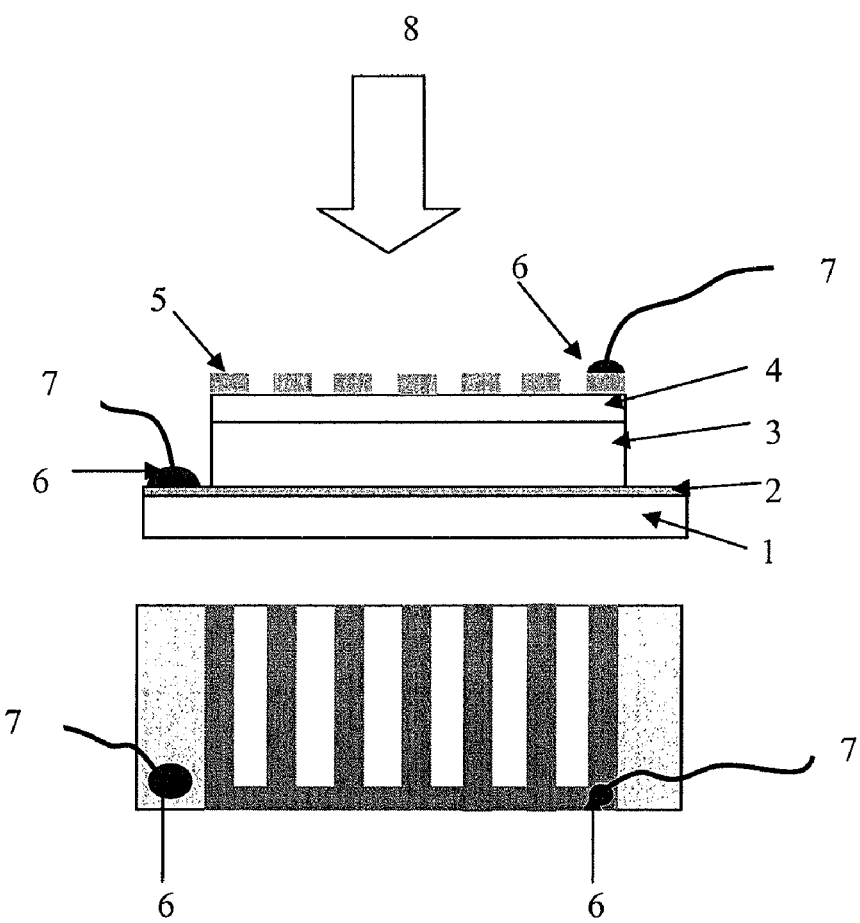
FIG. 2 illustrates a cross-section and an overview of an embodiment of another semiconducting device described herein.
Figure 3:
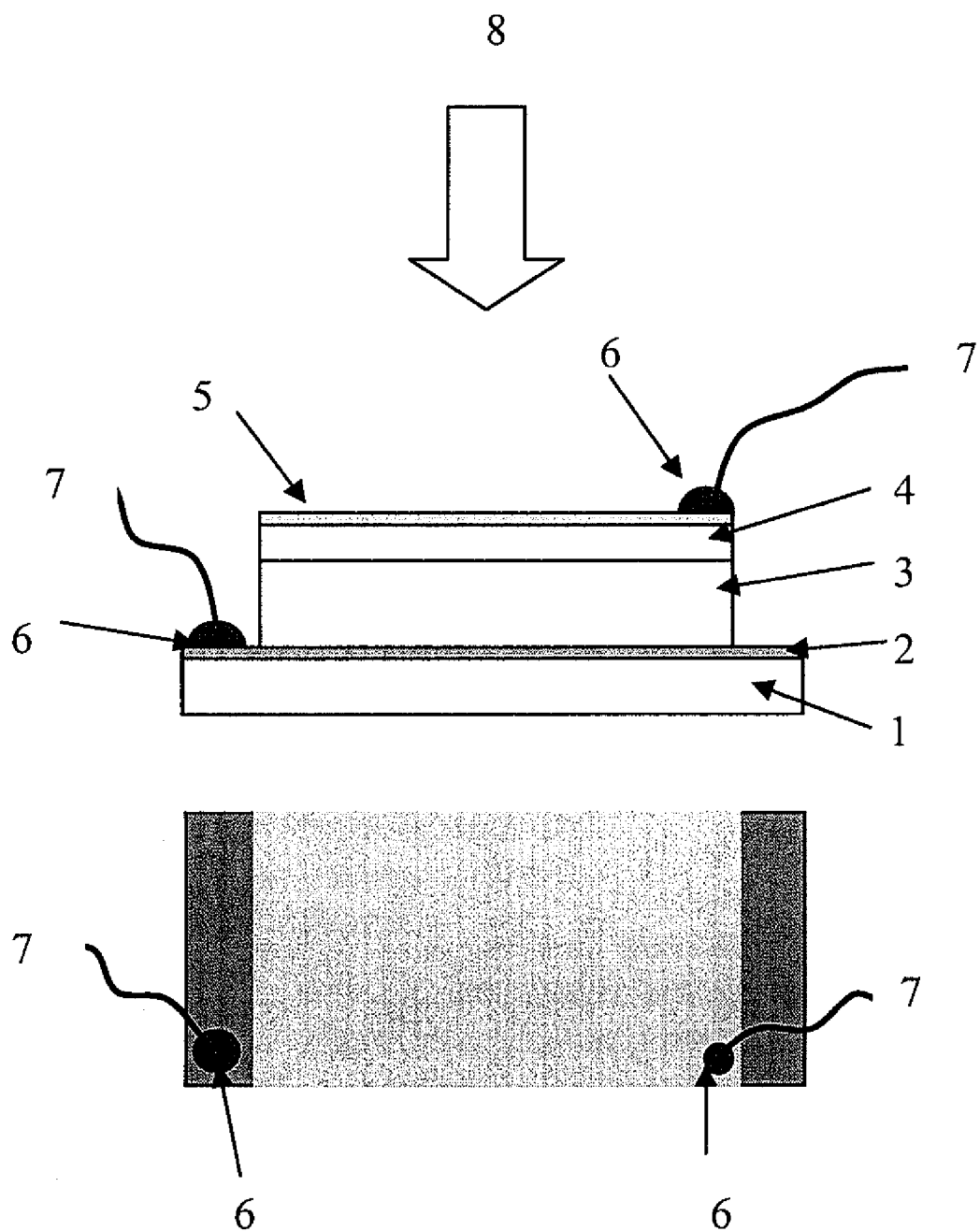
FIG. 3 illustrates a cross-section and an overview of an embodiment of another semiconducting device described herein.

One or more wires 7 may be attached to the electrodes, as shown in FIGS. 2 and 3. In an embodiment, the wires comprise gold. The wires 7 can be attached with any suitable attaching material. For example, the attaching material can comprise conductive epoxy resin with silver fillers. One of the electrodes, typically the conductive transport layer 5, is incident to light 8.

Described herein is an n-type semiconducting layer made by a process that comprises pyrolyzing a polymer layer, wherein the polymer layer comprises nitrogen and carbon. In an embodiment, the n-type semiconducting layer is in the form of a film having a thickness from about 20 nanometers to about 40 microns. In an embodiment, the thickness of the n-type semiconducting layer is from about 20 nanometers to about 1 micron. In an embodiment, the thickness of the n-type semiconducting layer is about 20 microns or less.

Described herein is a p-type semiconducting layer made by a process that comprises pyrolyzing a polymer layer, wherein the polymer layer comprises aromatic and aliphatic functional groups. In an embodiment, the p-type semiconducting layer is in the form of a film having a thickness from about 20 nanometers to about 40 microns. In an embodiment, the thickness of the p-type semiconducting layer is from about 20 nanometers to about 1 micron. In an embodiment, the thickness of the p-type semiconducting layer is about 20 microns or less.

The thickness of carbon semiconductor films formed after pyrolyzation of the polymer layers described herein possess the ability to have a greater range of film thicknesses compared to prior semiconducting films. For example, previous semiconducting layers where constrained to be at least about 20 micrometers in thickness. Such thickness may cause excessive absorption of photons in the carbon-containing layers. Excessive photon absorption leads to a decrease in the photon-generated carriers in p-type and n-type semiconducting layers.

The one or more polymer precursors described herein, using polymeric coating techniques, such as spin-coating, can have thicknesses in the nanometer range. Methods described herein can better control the film thickness by controlling the viscosity of the precursor solutions and/or coating conditions, which may include spin rate and coating durations. It is possible to form films with thicknesses ranging from about 20 nanometers to about 40 micrometers. The thickness of the semiconductor layers may be optimized to achieve high efficiency of the device.

The pyrolyzed polymeric materials described herein can be used to form semiconducting devices, such as semiconducting films. In some embodiments, the present invention relates to a semiconductor comprising a semiconducting material and/or a semiconducting film. In some embodiments, the present invention relates to a semiconductor. In some embodiments, the present invention relates to a solar cell comprising a material, film, or semiconductor described herein. In an embodiment, a solar cell comprises a p-n junction and electrodes made of indium tin oxide or gold on the side of light incidence and molybdenum or aluminum on the bottom that were deposited on substrates such as glass, silicon.

Described herein are semiconducting devices. In an embodiment, the semiconducting device comprises a substrate, an n-type semiconducting layer positioned over the substrate, and a p-type semiconducting layer positioned over the substrate. In an embodiment, the n-type semiconducting layer comprises a pyrolyzed carbon- and nitrogen-containing polymer. For example, the n-type semiconducting layer can comprise a pyrolyzed polyimide. In an embodiment, the p-type semiconducting layer comprising a pyrolyzed aromatic- and aliphatic-group-containing polymer. For example, the p-type semiconducting layer can comprise a pyrolyzed pitch selected from asphalt and a petroleum pitch. However, it is also contemplated that the n-type layer can comprise non-nitrogen containing polymer and/or that the p-type layer can comprise a nitrogen-containing polymer. As described above and in the examples below, the characterization of an n-type or p-type layer can also be adjusted based on pyrolysis conditions, such as temperature and duration. Both the p-type semiconducting layer and the n-type semiconducting layer can be formed by pyrolysis. Preferably, the pyrolysis is under nonoxidizing conditions.

Positioning of the n-type and p-type layers can vary. In an embodiment, the p-type semiconducting layer is positioned over the n-type semiconducting layer. In an embodiment, the n-type semiconducting layer is positioned over the p-type semiconducting layer. The n-type and p-type layers, in conjunction, comprise a p-n junction formed by contact of the p-type semiconducting layer with the n-type semiconducting layer. The semiconducting devices described herein provide advantageous band gap values. In an embodiment, the band gap is from about 0.1 to about 3.0 eV.

The semiconducting device can further include electrode layers, which can be placed on opposite sides of the n-type and p-type semiconducting layers. In an embodiment, a first electrode layer is positioned between the substrate and the n-type semiconducting layer. In an embodiment, a transparent conductive electrode layer positioned over the p-type semiconducting layer. Either p-type or n-type semi conducting carbon films may be supported by metal substrates made of aluminum, copper, and stainless steel that were used also as a bottom electrodes. Transparent conductive electrodes may be formed on the side of light incidence by vacuum evaporation or sputtering.

The thickness of the semiconducting layers can vary, depending on the usage of the semiconducting device. In an embodiment, the semiconducting layer is less than about 40 micrometers thick. In an embodiment, the semiconducting layer is less than about 20 micrometers thick. In an embodiment, the semiconducting layer is less than about 10 micrometers thick.

In addition to the combination of semiconducting layers previously discussed, a silicon-based semiconducting layer can also be used to prepare semiconducting devices described herein. Based on the wet spin coating and pyrolysis processes, a p-n junction can be formed by using either the combination of p-type carbon and n-type silicon or the combination of n-type carbon and p-type silicon. For example, a polymer precursor can be wet spun onto a silicon wafer substrate. Such a device containing semiconducting carbon and semiconducting silicon exhibited a photocurrent under illumination of light with the spectra similar to sun. An etching process may be necessary to remove the oxide layer on the surface of silicon wafer before spin coating a polymer precursor thereon. Depending on the thickness of the oxide layer, adjustment of etching time is needed.

In an embodiment, a semiconducting device comprises a substrate, an n-type semiconducting layer positioned over the substrate, and a p-type semiconducting layer positioned over the substrate, wherein one of the n-type or p-type semiconducting layer comprises silicon and the other comprises carbon. Any of the n-type or p-type carbon containing semiconductor layers that are described herein can be combined with a corresponding silicon semiconductor layer. In an embodiment, the n-type semiconducting layer comprises silicon and the p-type semiconducting layer comprises a pyrolyzed aromatic- and aliphatic-group-containing polymer. In an embodiment, the p-type semiconducting layer comprises silicon and the n-type semiconducting layer comprises a nitrogen-containing polymer.

The semiconducting layers and subsequent semiconducting devices described herein have improved mechanical strength as compared to comparable devices. Additionally, the semiconducting layers described herein are capable of being built on a substrate comprising quartz, ceramics, or metals.

The methods of preparing semiconducting layers disclosed herein also offer advantages over comparable methods, such as those which utilize chemical vapor deposition. Chemical vapor deposition often requires special equipment, which can increase the manufacturing cost of the device. Furthermore, dopants and precursors used in the prior semiconducting layers can be toxic, causing environmental and other problems. Methods disclosed herein can include wet-spin coating processes and pyrolysis processes, one or more of which may replace at least some chemical vapor deposition processes of comparable methods. Wet-spin coating and pyrolysis processes are associated with lower manufacturing costs and reduced environmental consequences. Thus, a device disclosed herein may be made with relatively cheap precursors and/or may not require expensive equipment required by comparable methods.

Methods disclosed herein offer improved control over several aspects of the semiconducting films including, for example, the band gap of semiconducting films. For example, the band gap can be adjusted within a range of about 0.1 to about 3.5 eV. The band gap may be controlled by adjusting precursor compositions (e.g. nitrogen-containing polymer precursors or aromatic- and aliphatic-containing polymers), pyrolysis temperature, pyrolysis duration, and the environment (e.g. non-oxygen, reducing gas, etc.) of the pyrolysis.

In an embodiment, the present invention provides amorphous carbon films formed on substrates by CVD, PECVD, vacuum evaporation, and/or e-beam evaporation. The films can contain nitrogen, boron, phosphorous as dopants, which can be either p-type or n-type semiconductors or have band gaps in the range of 0.1 to 3.0 eV. P-n junction can be formed by depositing and pyrolyzing asphalt or polyimide precursors on such amorphous carbon films.

In an embodiment, the present invention provides an electrode made of transparent conductive polymers formed on the incident light side of solar cells. The electrode can be coated on the top of carbon film by spin coating or dip coating. The electrode can have a maximum transmittance of 90% at a thickness of 65 nm in the wavelength minimum range of 300 nm to the wavelength maximum range of 2400 nm and of 600Ω electrical resistance at a span of 1 cm for measurement for the thickness of 318 nm.

In an embodiment, the present invention provides an electrode made of carbon nanotubes dispersed in a polymer. Pyrolyzed carbon films typically have low carrier mobility compared with traditional semiconducting layers used in electronic industry, such as silicon, germanium, and gallium nitride. Due to the low carrier mobility, the thickness range of pyrolyzed carbon films in semiconducting devices is limited to a certain range that can match the carrier diffusion length, which is related to carrier mobility and lifetime. As a result, the absorption of photons in the carbon film is decreased. Semiconducting carbon nanotubes exhibit very high carrier mobility and behave as n-type semiconductor. Additionally, fullerene $C_{60}$ and its various derivatives, such as PCBM ([6,6]phenyl $C_{61}$ butyric acid methyl ester) exhibit n-type behavior and high carrier mobility. Thus, carbon nanotubes, fullerene, and fullerene derivatives can all be used as electron acceptors in organic photovoltaic devices.

In preparation of n-type semiconducting carbon films from polymeric precursors described herein, higher temperature and duration are favored in order to promote the development of aromatic structure in the resulting pyrolyzed carbon films, thus providing an electron carrier. Semiconducting carbon nanotubes, fullerene, and fullerene derivatives can be introduced into the polymeric precursors described herein to increase the carrier mobility and electrical conductivity in carbon films.

Increasing pyrolysis temperature and extending pyrolysis duration carries the consequence of decreasing both the optical band gap and the electrical resistivity of the pyrolyzed carbon films. By introducing single wall carbon nanotubes, fullerene, and/or fullerene derivatives into the polymer precursors, electrical conductivity can be increased while the optical band gap is maintained with no significant change.

EXAMPLES

Example 1

Polyimide Precursors

Example 1a

A first polyimide precursor, "Polyimide-I," was synthesized from 4,4'-oxydiphthalic anhydride (OPDA) and 1,3-bis (4-aminophenoxy)benzene (APB). APB was first dissolved in dimethylacetamide (DMAc). Then, ODPA was added to the APB/DMAc solution until the DMAc content in polyamic acid solution was about 80%. This polyamic acid solution was constantly and mechanically mixed for more than 12 hours.

Example 1b

A second polyimide precursor, "Polyimide-II," was synthesized from p-phenylenediamine (PDA) and 3,3',4,4'-biphenyltetra carboxylic dianhydride (BPDA). First, PDA was dissolved in N-methylpyrrolidone (NMP). Then, BPDA was added to the PDA/NMP solution. An additional amount of NMP was further added such that the solution comprised NMP in an amount of about 80% by weight of the total solution.

Example 1c

A third polyimide precursor, "Polyimide-III," was synthesized from 4,4'-Oxydianiline (DDE) and pyromellitic dianhydride (PMDA). First, DDE was dissolved in N-methylpyrrolidone (NMP). Then, PMDA was added to the DDE/NMP solution. An additional amount of NMP was further added such that the solution comprised NMP in an amount of about 80 wt % in the polyamic acid solution.

Example 2

Thermogravimetric Analysis of Polyimide Precursors

Figure 4:
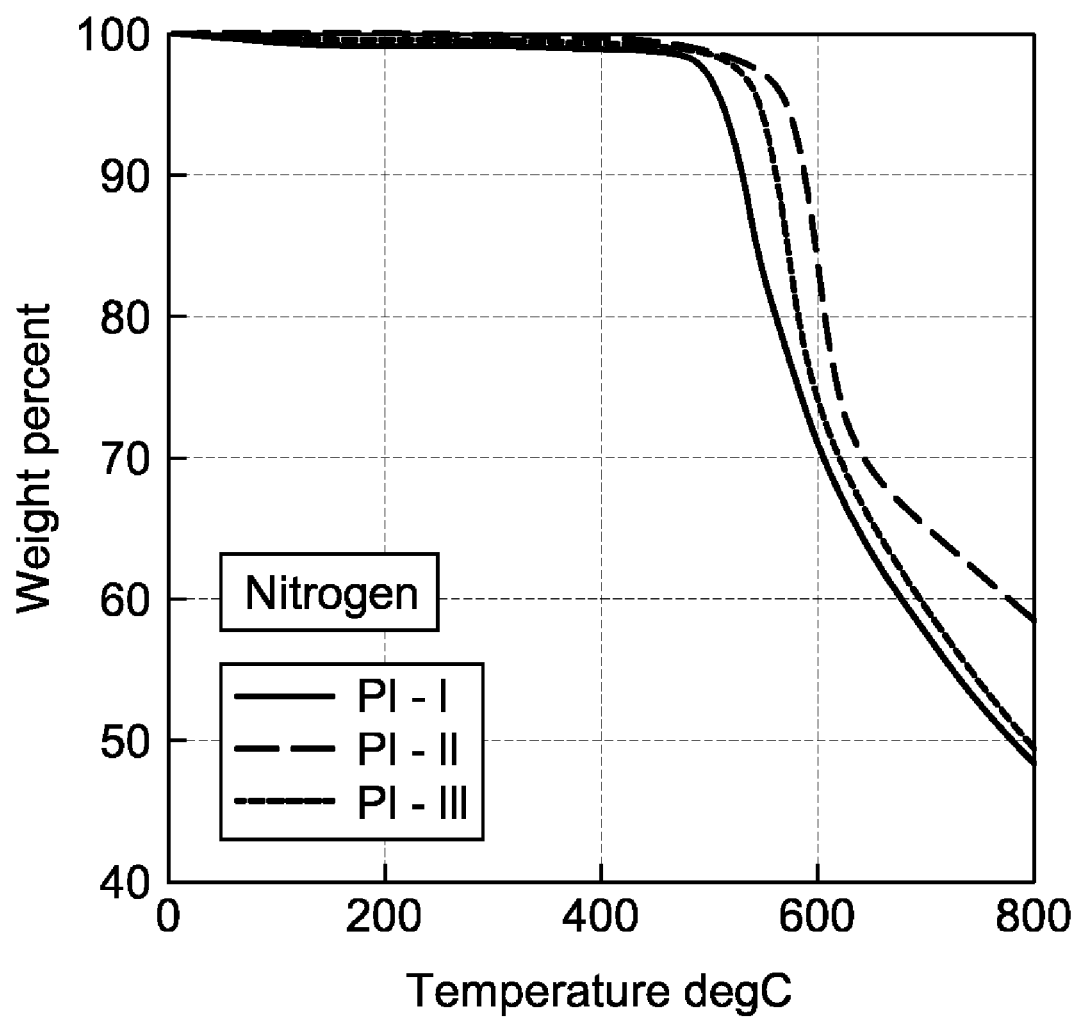
FIG. 4 shows a thermogravimetric plot of the weight loss of three polyimide precursors as a function of temperature.

The three polyimide precursors described in Example 1 underwent thermogravimetric analysis (TGA) to determine their weight loss as a function of temperature. FIG. 4 shows results of the TGA of each of Polyimide-I, Polyimide-II, and Polyimide-III. The samples were heated under nitrogen and the weight loss measured as the temperature increased. FIG. 4 shows that the weight loss of each of the samples begins at about 500° C. Furthermore, the weight percent decreases by as much as about 50% at about 800° C.

Example 3

Polyimide Precursor Films

Each of the polyimide precursors from Example 1 were formed into films by first diluting the precursors by adding N,N-Dimethylacetamide (Aldrich-سigma, 99.8%). Each diluted polyimide precursor was then filtered by passing the diluted precursors through a polytetrafluoroethylene (PTFE)

filter with a pore size of about 0.2 μm to produce Polyimide-I Solution, Polyimide-II Solution, and Polyamide-III Solution, respectively.

Substrates (e.g. substrates comprising quartz, fused silica, and/or silicon) were cleaned in a beaker containing acetone or isopropanol under sonic vibration. Polyimide I solution and Polymide III solution were each coated onto a substrate using a spin coater at a spinning rate in the range of 1000 to 5000 rpm, forming polyimide precursors films on the substrates. The polyimide precursor films were cured at 100° C. for 30 minutes, followed by curing at 150° C. for 30 minutes and curing then at 360° C. for 15 minutes in an air-circulated oven with programmable temperature profiles.

Example 4

Pyrolysis of Polyimide Precursor Films

The cured polyimide precursor films from Example 3 were placed in a quartz sample holder and pyrolyzed in high purity nitrogen in a quartz tube furnace with programmable temperature profiles. Prior to the pyrolysis, the quartz tube containing the samples was vacuumed to below 0.1 Pa and purged with nitrogen. Such a procedure was repeated five times to remove remaining air. The nitrogen flow rate was adjusted to 200 mL/min. Polyimide precursor films were first heated to 300° C. at a ramp of 10° C. per minute, then heated to 550° C. After being held for 240 minutes, the precursor film was cooled down to room temperature at a rate of 10° C./min. Various properties of the resulting semiconductor layer examples derived from the Polyimide-III precursor pyrolyzed at various temperatures were measured, and a summary on is presented in Table 1 below.

Example 5

Asphalt Solution and Asphalt Precursor Films 1.57 grams of asphalt was dissolved in 6.28 grams of toluene (Fischer Scientific, 99.9%). The Asphalt solution was transferred to a glass tube and separated in a centrifugal separator at rotating rate of 3500 rpm and kept for 5 minutes. The upper part of the solution in the glass tube was separated from the undissolved part remaining at the bottom of tube. The asphalt solution was spin-coated on a quartz or silicon substrate at a spin rate ranging from 1000 to 5000 rpm for a duration ranging from 10 to 50 seconds to get different thicknesses of asphalt precursor films. The coated substrates were pre-heated on a hot plate at 100° C. to 250° C. in ambient atmosphere for 10 to 30 minutes to remove the solvent and stabilize the asphalt precursor films. The pre-heated samples were pyrolyzed in a tube furnace at 500° C. for 16 hours in vacuum conditions maintained by a vacuum pump.

Example 6

Semiconductor Film and Device Formation

The Polyimide-III precursor described in Example 1 was diluted to a proper viscosity and filtered by passing it through a 0.2 μm PTEF filter. Molybdenum coated glass substrates were sonically cleaned in acetone. A polyimide precursor film was formed on the top of molybdenum layer that acts as bottom electrode by spin coating at a rate of 2000 rpm for 45 seconds. The substrate was masked on the side of molybdenum layer to remain a part of molybdenum that was not coated by polyimide solution (see, for example, the portions

TABLE 1

| Polyimide type | Pyrolysis Temperature (° C.) | Duration (min) | Spin rate (rpm) | Thickness (nm) | Optical Eg (eV) | Surface electrical resistivity (Ω/) |
|---|---|---|---|---|---|---|
| III | 500 | 240 | 1000 | 516 | 1.6 | >$10^{12}$ at 100 V |
| III | 500 | 240 | 2000 | 279 | 1.7 | >$10^{12}$ at 100 V |
| III | 500 | 240 | 3000 | 200 | 1.6 | >$10^{12}$ at 100 V |
| III | 550 | 240 | 1000 | 376 | 0.8 | $4.8 \times 10^9$ at 10 V |
| III | 550 | 240 | 2000 | 211 | 0.7 | $9.6 \times 10^9$ at 10 V |
| III | 550 | 240 | 3000 | 183 | 0.7 | $5.0 \times 10^9$ at 10 V |
| III | 580 | 240 | 1000 | 425 | 0.6 | $1.7 \times 10^8$ at 10 V |
| III | 580 | 240 | 2000 | 209 | 0.7 | $3.3 \times 10^9$ at 10 V |
| III | 580 | 240 | 3000 | 174 | 0.7 | $1.9 \times 10^9$ at 10 V |
| III | 620 | 240 | 1000 | 314 | 0.13 | $4.7 \times 10^5$ at 10 V |
| III | 620 | 240 | 2000 | 196 | 0.15 | $4.9 \times 10^5$ at 10 V |
| III | 620 | 240 | 3000 | 133 | 0.20 | $6.6 \times 10^5$ at 10 V |

The transmission or absorption spectra of pyrolyzed polyimide precursor films were measured using spectrometer (SHIMATZU, UV-3600) in the wavelength range of 200 to 3000 nm. Film thickness was measured using surface stylus profiler. Based on the film thickness, optical band gap was calculated from absorption spectra of pyrolyzed films using Tauc relation, which was described as $(\alpha h\upsilon)^{1/2}=A(h\upsilon-E_g)$, where $\alpha$ is absorption coefficient, $h\upsilon$, the incident photon energy, A, a constant, and $E_g$, the optical band gap. Surface electrical resistivity of the pyrolyzed films was measured by using surface electrical resistance meter with circular electrodes under different applied voltages.

of the molybdenum layer not under the polyimide layer in FIG. 2). The polyimide precursor film was cured at 360° C. for 15 minutes in an air-circulated oven with programmable temperature profiles.

To transform the polyimide precursor films into an n-type semiconducting layer, the film was pyrolyzed in a tube furnace at temperature ranging from 400° C. to 900° C. for 0.5 to 20 hours in vacuum or nitrogen or other inert atmosphere. The flow rate of nitrogen was kept in the range of 10 to 500 mL/min. The n-type semiconducting layer obtained from pyrolyzed polyimide precursors has a thickness ranging from 0.01 to 100 μm. An asphalt precursor film was formed on the pyrolyzed polyimide film by spin coating using the solution from Example 5 at a spin rate ranging from 1000 to 5000 rpm for a duration ranging from 10 to 50 seconds in order to obtain films of various thicknesses.

Asphalt precursor films were transformed into p-type semiconducting layers by pyrolyzing in a vacuum or inert atmosphere such as nitrogen etc. at temperature ranging from 400° C. to 700° C. for a duration ranging from 0.5 to 20 hours.

A conductive transparent electrode layer of Indium Tin Oxide (ITO) (e.g. FIG. 1) or gold (e.g. FIG. 2 and FIG. 3) was deposited on the top of the p-type semiconducting layer made of pyrolyzed asphalt precursor by vacuum deposition or sputtering methods to form a solar cell. The gold layer may be, for example, masked and etched to form strips as shown in FIG. 2. Gold wires were attached to the top ITO and bottom molybdenum electrodes with conductive epoxy resin with silver fillers.

Example 7

Semiconductor Film and Device Formation

The Polyimide-III precursor from Example 1 was diluted to proper viscosity and filtered by passing it through a 0.2 µm PTEF filter. Molybdenum-coated glass substrates were sonically cleaned in acetone. A polyimide precursor film was formed on the top of the molybdenum layer that acts as bottom electrode by spin coating the Polymide-III solution at a rate of 2000 rpm for 45 seconds. The substrate was masked on the side of molybdenum layer such that part of molybdenum layer remained uncoated by polyimide solution. The polyimide precursor film was cured at 360° C. for 15 minutes in an air-circulated oven with programmable temperature profiles.

An asphalt precursor film was formed on the cured polyimide films by dropping 1 mL of asphalt solution from Example 5 on the cured polyimide films and by spin coating using the solution as described in Example 5 at a spin rate of 2000 rpm for 45 seconds. The asphalt precursor films were pre-heated on a hotplate at 250° C. for 15 minutes in ambient atmosphere to remove the solvents. Heterojunctions were formed by pyrolyzing the asphalt and polyimide precursor films in a tube furnace at temperature ranging from 400° C. to 900° C. for 0.5 to 20 hours in vacuum or nitrogen or other inert atmosphere. The flow rate of nitrogen was kept in the range of 10 to 500 mL/min.

A conductive transparent electrode layer of Indium Tin Oxide (ITO) or gold was deposited on the top of p-type semiconducting layer made of pyrolyzed asphalt precursor by vacuum deposition or sputtering methods. Gold wires were attached to top ITO and bottom molybdenum electrodes with conductive epoxy resin with silver fillers.

Example 8

Pyrolysis of Polymeric Precursors in a Hydrogen Atmosphere

Asphalt precursors (from Exxon) were dissolved in toluene at concentration of 5% and then spin-coated onto a silica glass substrate. The film thickness was in the range of 20 to 500 nm. The asphalt precursor films were heated on hot plate to remove solvent and then pyrolyzed in partly reductive atmosphere containing 3% hydrogen and 97% nitrogen in a tube furnace. The gas mixture was kept flowing at a rate of 20 to 100 ml/min through the tube furnace during pyrolysis. The precursor films were pyrolyzed at 450° C. for 20 hrs. The heating ramp was at 5 to 10 C/min. Optical band gap was obtained through absorption using UV-Vis-NIR spectrometer (SHIMADZU UV-3600) and Tauc equation. Results are provided in Table 2.

TABLE 2

| Asphalt content (%) | Pyrolysis condition | Optical band gap (eV) |
|---|---|---|
| 5% | 450° C.-20 hr-N2 | 0.4 |
| 5% | 450° C.-20 hr-3% H2 + 97% N2 | 1.0 |
| 15% | 450° C.-4 hr-3% H2 + 97% N2 | 0.8 |
| 5% | 450° C.-4 hr-vacuum | 0.3 |

Example 9

Raman Spectra of Pyrolyzed Carbon Films

Raman spectroscopy was used to characterize semiconducting carbon films for solar cell devices. In the Raman spectra of pyrolyzed amorphous carbon, two absorption bands called D band and G band can be observed. The G band usually occurs between 1480 and 1580 cm-1, while the D band position appears between 1320 and 1440 cm-1. The intensity ratio of the D band to the G band as represented by the integrated area of these two bands is usually associated with the size of the grapheme structure. Pyrolyzed amorphous carbon films used for forming p-n junction were characterized using Micro Laser Raman spectrometer (Jobin Yvon S.A.S. LabRam HR 8000). The results are provided in Table 3 below. The semiconducting pyrolyzed carbon layers possess good I(D)/I(G) ratios because a ratio at about 1.0 or below provides conductivity properties similar to graphite, while a ratio at about 3.0 or greater provides conductivity properties similar to diamond.

TABLE 3

| Sample | Pyrolysis condition | I(D)/I(G) |
|---|---|---|
| Polyimide-I | 800° C. for 4 hr under $N_2$ | 2.3 |
| Polyimide-III | 800° C. for 4 hr under $N_2$ | 2.2 |
| PolyimideI-III | 640° C. for 6 hr under $N_2$ | 2.3 |
| Polyacrylonitrile | 600° C. for 1 hr under $N_2$ | 2.2 |
| Asphalt | 400° C. for 4 hr under vacuum | 1.6 |
| Asphalt | 500° C. for 4 hr under 3% $H_2$ + 97% $N_2$ | 1.6 |
| Asphalt | 500° C. for 4 hr under vacuum | 1.5 |
| Asphalt | 500° C. for 15 hr under vacuum | 1.5 |
| Asphalt | 500° C. for 4 hr under $N_2$ | 1.5 |
| Polyacrylonitrile | 950° C. for 1 hr under $N_2$ | 2.6 |
| Polyacrylonitrile | 900° C. for 1 hr under $N_2$ | 2.5 |
| Polyacrylonitrile | 800° C. for 1 hr under $N_2$ | 2.8 |
| Polyacrylonitrile | 800° C. for 20 hr under $N_2$ | 2.6 |

Example 10

Silicon Substrate and Photovoltaic Devices made of C/Si Junctions

Figure 5:
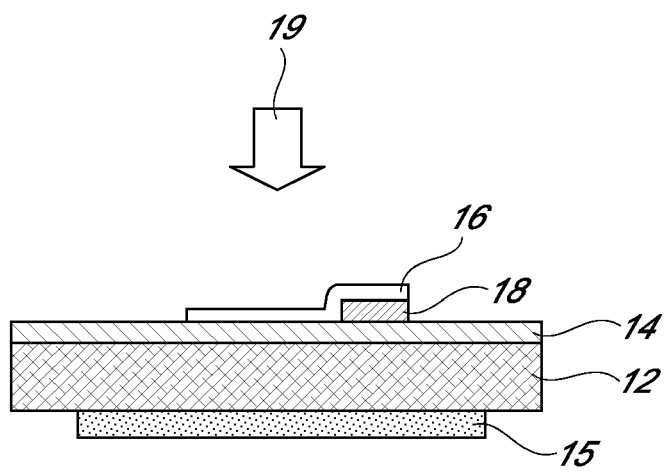
FIG. 5 illustrates a cross-section an embodiment of a semiconducting device that includes an insulating layer.

Semiconducting devices that comprise silicon in either of the n-type or p-type semiconducting layers were also manufactured, and is illustrated in FIG. 5. An n-type silicon wafer 12 was etched in 2% diluted HF in water for 3 min. in a PTFE container until the surface of the silicon became hydrophobic. The etched silicon substrate 12 was rinsed with copious amount of deionized water and then blow-dried with compressed dry nitrogen. A precursor film 14 was formed on the silicon substrate by using 5% asphalt solution in toluene at spin rate of 4000 rpm for 30 sec. The precursor film 14 was subsequently dried on a hot plate in ambient atmosphere at 180° C. for 30 min to evaporate the solvent in the precursor film 14. The precursor film 14 was then pyrolyzed in a tube furnace in a vacuum at a pressure lower than about 0.1 MPa at 480° C. for 20 hrs. Precursor film 14 is on the side incident to light 19.

Gold electrodes 15, 16 were formed by thermal evaporation on both carbon film and silicon substrate sides. To ensure the active area, an insulator layer 18 of about 500 nm thickness comprising polyimide was formed on the pyrolyzed carbon film and cured at 300° C. for 15 min. before evaporation of the gold electrodes. An insulator layer can be used in any of the embodiments described herein. Lead wires (not shown) were attached to the gold electrodes by using silver paint.

Figure 6:
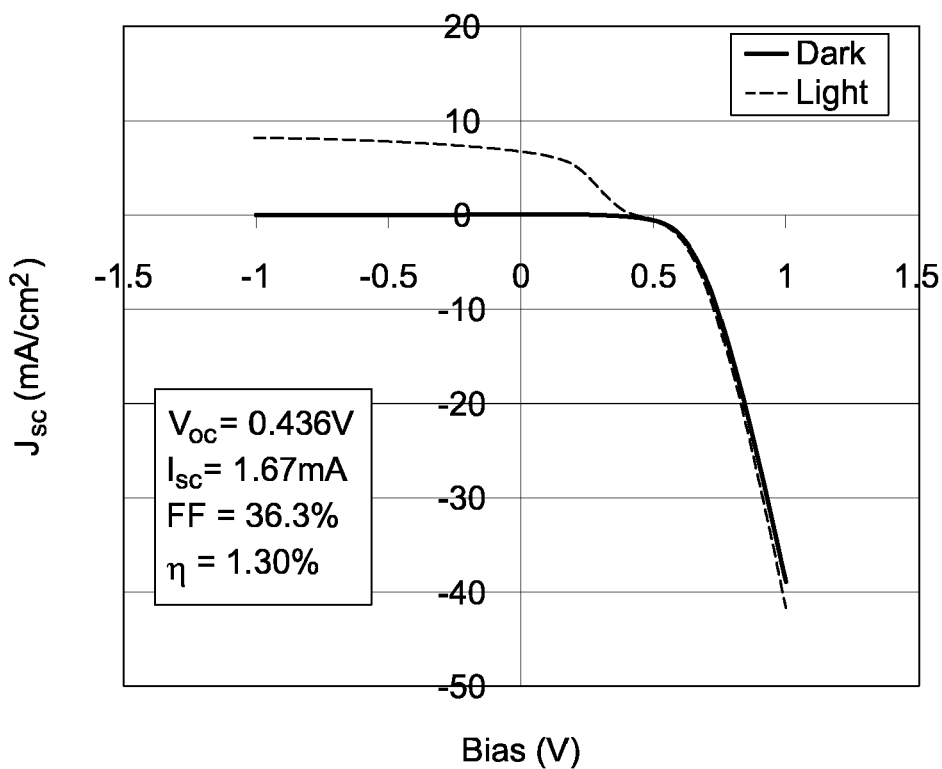
FIG. 6 is an I-V curve of a semiconducting device comprising a silicon semiconducting layer and a pyrolyzed carbon semiconducting layer.

The thickness of the pyrolyzed carbon film and the electrode at light incident side were about 40 nm and about 15 nm, respectively. The photocurrent of such a device was measured using a system comprising a solar simulator (Yamashita Denso), electrometer (Advantest R6243) and a computer. The measurement was carried out at AM 1.5 and 1 SUN (100 mW/cm2). The device with an active area of 0.23 cm$^2$ demonstrated Voc of 436 mV, Isc of 1.67 mA, fill factor of 36.3%, and efficiency of 1.30%. I-V curves of the material in the dark and under illumination were showed in the graph displayed as FIG. 6.

Example 11

Gold/Polyimide/Silicon/Gold Semiconductor Device

An n-type silicon wafer was etched in 2% diluted HF in water for 3 min in PTFE container until the surface of silicon became hydrophobic. The etched silicon substrate was rinsed with copious amount of deionized water and then blow-dried with compressed dry nitrogen. A polymeric precursor film was formed on the silicon substrate by using 7% polyimide solution in dimethyl acetamide at a spin rate of 4000 rpm for 30 sec. The film was subsequently dried on a hot plate in ambient atmosphere at 100° C. for 30 min to evaporate the solvent in the precursor film. The precursor film was then pyrolyzed in a tube furnace in 99.99% nitrogen at 600° C. for 20 hrs.

Figure 7:
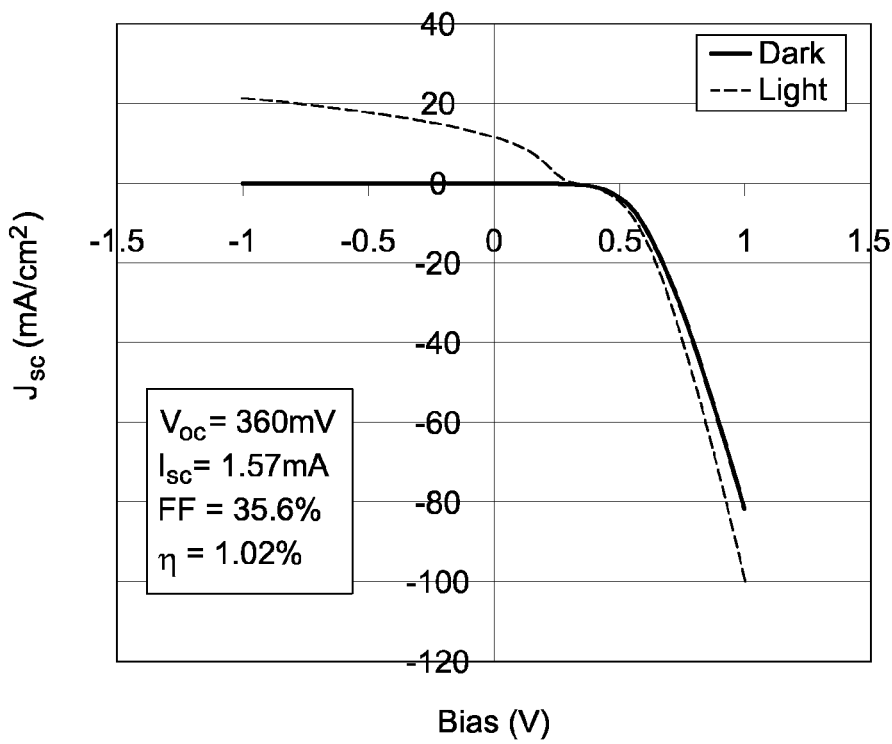
FIG. 7 is an I-V curve of a semiconducting device comprising a silicon semiconducting layer and a pyrolyzed carbon semiconducting layer.

Gold electrodes were formed by thermal evaporation on both the pyrolyzed carbon film and the silicon substrate sides. To ensure the active area, an insulator layer of about 500 nm comprising polyimide was formed on the carbon film and cured at 300° C. for 15 min. prior to the evaporation of gold electrodes (See FIG. 5). Lead wires were attached to the gold electrodes by using silver paint. The thickness of pyrolyzed carbon film and the electrode at the light incident side were about 40 nm and 15 nm respectively. The photocurrent of such a device was measured using a system comprising a solar simulator (Yamashita Denso), electrometer (Advantest R6243), and a computer. The measurement was carried out at AM 1.5 and 1 SUN (100 mW/cm2). The device with an active area of 0.1 cm$^2$ demonstrated Voc of 360 mV, Isc of 1.57 mA, fill factor of 35.6%, and an efficiency of 1.02%. I-V curves of the material in the dark and under illumination were showed in the graph displayed as FIG. 7.

Example 12

ITO/Asphalt/Silicon/Gold Semiconductor Device

An n-type silicon wafer was etched in 2% diluted HF in water for 3 min. in a PTFE container until the surface of the silicon became hydrophobic. The etched silicon substrate was rinsed with copious amount of deionized water and then blow-dried with compressed dry nitrogen. A polymer precursor film was formed on the silicon substrate by using 5% asphalt solution in toluene at spin rate of 2000 rpm for 30 sec. The film was subsequently dried on a hot plate in an ambient atmosphere at 180° C. for 30 min. to evaporate the solvent in precursor film. The polymeric precursor film was then pyrolyzed in a tube furnace in a vacuum at pressure lower than about 0.1 MPa at 530° C. for 20 hrs.

Gold electrodes were formed by thermal evaporation on back of silicon substrate. To ensure the active area, an insulator layer (See FIG. 5) of about 500 nm comprising polyimide was formed on the pyrolyzed carbon film and cured at 300° C. for 15 min. An ITO electrode was formed on the light incident side by a sputtering process. The ITO electrode had a thickness of about 100 nm and a sheet resistance of about 100Ω/.

Figure 8:
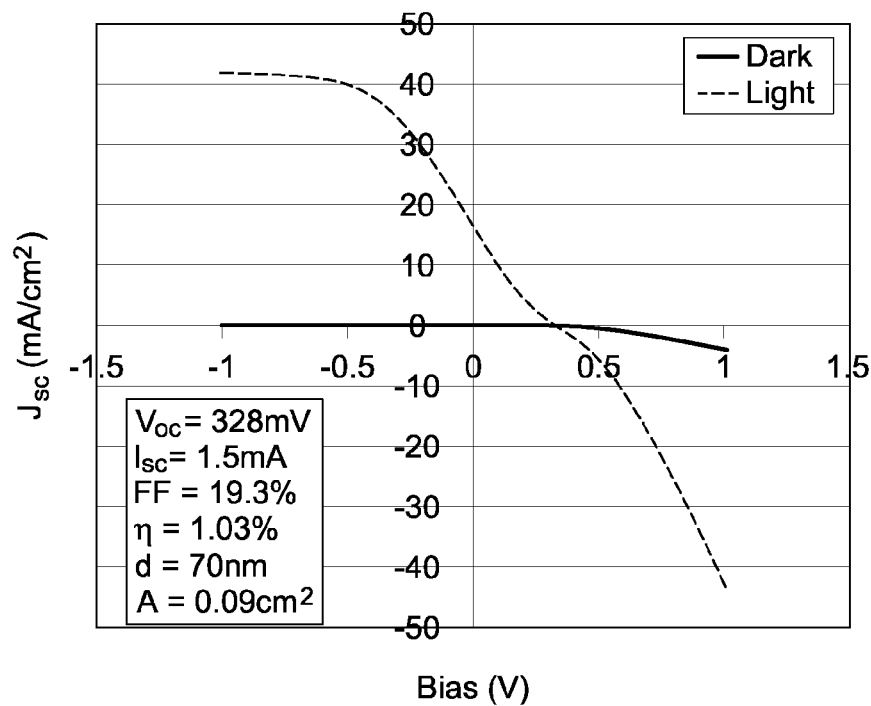
FIG. 8 is an I-V curve of a semiconducting device comprising a silicon semiconducting layer and a pyrolyzed carbon semiconducting layer.

Lead wires were attached to the gold and ITO electrodes by using silver paint. The thickness of the pyrolyzed carbon film was about 70 nm. The photocurrent of the device was measured using a system comprising a solar simulator (Yamashita Denso), electrometer (Advantest R6243) and a computer. The measurement was carried out at AM 1.5 and 1 SUN (100 mW/cm2). The device with an active area of 0.09 cm$^2$ demonstrated Voc of 328 mV, Isc of 1.5 mA, fill factor of 19.3%, and an efficiency of 1.03%. I-V curves of the material in the dark and under illumination were showed in the graph displayed as FIG. 8.

Example 13

Carrier Mobility of Pyrolyzed Carbon Films

Carrier type, carrier mobility, and carrier density of semiconducting pyrolyzed carbon films comprising asphalt, Polyimide-I (PI-I) and Polyimide-III (PI-III) from Example 1, polyacrylonitrile (PAN) precursors, and DPB was characterized by measuring the Hall Effect. DPB is a polymer that is manufactured by reacting DPYA-PDA (2-(2,2'dipyridal) amino-4,6-bis(1,4-phenylenediamino)1,3,5-triazine) with BTDA (meso-butanetetreacarboxylicdianhydride) in dimethyl carbonate at room temperature. The following Table 4 provides processing conditions, carrier type (C.T.), carrier mobility (C.M.), carrier density (C.D.), and sheet resistance (S.R.) of various pyrolyzed carbon films. By adjusting the pyrolysis condition, either p-type or n-type semiconducting carbon films can be obtained.

TABLE 4

| Sample | Process condition | S.R. (Ω/☐) | C.M (cm$^2$/V · s) | C.D. (×10$^{20}$/cm$^3$) | C.T | Thickness (nm) |
|---|---|---|---|---|---|---|
| Asphalt | 700° C.-10 hr-vacuum | 1553 | 0.43 | 3.46 | P | 270 |
| Asphalt | 700° C.-10 hr-vacuum | 1496 | 1.03 | 1.83 | P | 221 |
| Asphalt | 700° C.-10 hr-vacuum | 1552 | 0.02 | 76.0 | N | 225 |
| Asphalt | 700° C.-10 hr-vacuum | 1453 | 2.50 | 0.67 | P | 257 |

TABLE 4-continued

| Sample | Process condition | S.R. ($\Omega/\text{\c{e}}$) | C.M ($cm^2/V \cdot s$) | C.D. ($\times 10^{20}/cm^3$) | C.T | Thickness (nm) |
|---|---|---|---|---|---|---|
| Asphalt | 800° C.-10 hr-vacuum | 321 | 0.36 | 17.5 | N | 308 |
| Asphalt | 900° C.-10 hr-vacuum | 454 | 11.4 | 0.39 | P | 310 |
| PAN | 950° C.-1 hr-N2 | 152 | 0.67 | 32.5 | N | 188 |
| PAN | 850° C.-1 hr-N2 | 630 | 0.27 | 21.9 | N | 167 |
| PI-I | 800° C.-4 hr-N2 | 208 | 0.37 | 30.5 | N | 264 |
| PI-III | 800° C.-4 hr-N2 | 51 | 0.34 | 13.9 | N | 2567 |
| DPB | 800° C.-4 hr-N2 | 637 | 1.97 | 3.30 | P | 151 |

Example 14

Carbon Films Doped with Carbon Nanotubes

Polyacrylonitrile (Aldrich Mw=150,000) was dissolved in N,N-dimethylformamide (Aldrich, anhydrous, 99.9%) at a concentration of 5 wt % by magnetic stirring for more than 12 hours at 25° C. Single wall carbon nanotubes (SWCNT) were dispersed with a sonicator in N,N-dimethylformamide (DMF) at a concentration of 0.15 wt %. Spin-coating solutions were prepared by mixing SWCNT-DMF at varied ratios. Polymer precursor films were formed on silica glass substrates by spin coating at 1500 rpm for 45 seconds and then were dried on hot plate at 125° C. for 30 min to evaporate the solvent. The polymeric precursor films were first stabilized in air at 240° C. for 2 hrs and then pyrolyzed at 550° C. for one of 1 hour, 4 hours, or 10 hours in nitrogen (99.99%) at flow rate of 10 ml/min. The pyrolyzed carbon film thickness was measured with a surface stylus profiler (DEKTAK). Electrical conductivity was measured with an electrometer. Optical band gap was found from absorption spectra measured with UV-Vis-NIR spectrophotometer (SHIMADZU UV-3600) and based on Tauc equation.

Table 5 shows that the electrical conductivity of the pyrolyzed carbon films increases as carbon nanotube (CNT) content increases.

TABLE 5

| CNT content | Electrical conductivity (S/cm) | | |
|---|---|---|---|
| (wt %) | pyrolysis - 1 hr | pyrolysis - 4 hr | pyrolysis - 10 hr |
| 0 | $1.48 \times 10^{-4}$ | $5.10 \times 10^{-4}$ | $6.58 \times 10^{-4}$ |
| 0.68 | $1.26 \times 10^{-3}$ | $2.84 \times 10^{-3}$ | $4.45 \times 10^{-3}$ |
| 1.11 | $2.09 \times 10^{-3}$ | $5.95 \times 10^{-3}$ | $6.77 \times 10^{-3}$ |
| 2.70 | $8.92 \times 10^{-3}$ | $1.80 \times 10^{-2}$ | $2.09 \times 10^{-2}$ |

Table 6 shows that optical band gap remains consistent with increasing CNT content in the pyrolyzed carbon films.

TABLE 6

| CNT content | Optical band gap (eV) | | |
|---|---|---|---|
| (wt %) | pyrolysis - 1 hr | pyrolysis - 4 hr | pyrolysis - 10 hr |
| 0 | 0.47 | 0.42 | 0.40 |
| 0.68 | 0.45 | 0.45 | 0.45 |
| 1.11 | 0.50 | 0.40 | 0.40 |
| 2.70 | 0.35 | 0.38 | 0.38 |

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the preferred embodiments. At the very least, and not as an attempt to limit the application of the doctrine of equivalents to the scope of the claims, each numerical parameter should be construed in light of the number of significant digits and ordinary rounding approaches.

The above description discloses several methods and materials of the preferred embodiments. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method of manufacturing a semiconducting device, comprising:
    forming a first polymer layer over a substrate, wherein the first polymer layer comprises nitrogen and carbon;
    forming a second polymer layer over the substrate, wherein the second polymer layer comprises asphalt or petroleum pitch;
    pyrolyzing the first polymer layer under substantially nonoxidizing conditions selected to transform the first polymer layer into an n-type semiconducting layer; and
    pyrolyzing the second polymer layer under substantially nonoxidizing conditions selected to transform the second polymer layer into a p-type semiconducting layer.

2. The method according to claim 1, wherein the first polymer layer is formed over the second polymer layer.

3. The method according to claim 1, wherein the n-type semiconducting layer is in contact with the p-type semiconducting layer.

4. The method according to claim 1, wherein the temperature during pyrolysis of the first polymer layer is from about 400° C. to about 1000° C.

5. The method according to claim 1, wherein the temperature during pyrolysis of the second polymer layer is from about 400° C. to about 1000° C.

6. The method according to claim 1, wherein the nonoxidizing conditions comprise a vacuum environment.

7. The method according to claim 1, wherein the first polymer layer comprises at least one of polyimide, polyacrylonitrile, polyamide, and polyanidimide.

8. The method according to claim 7, wherein the first polymer layer comprises polyimide.

9. The method according to claim 1, wherein forming the first polymer layer comprises a wet process.

10. The method according to claim 9, wherein the wet process comprises spin-coating and/or dip-coating.

11. The method according to claim 1, wherein forming the second polymer layer comprises a wet process.

12. The method according to claim 11, wherein the wet process comprises spin-coating and/or dip-coating.

13. The method according to claim 1, further comprising forming a first electrode layer over the substrate and forming the first polymer layer over the first electrode layer.

14. The method according to claim 13, wherein the first electrode layer comprises molybdenum.

15. The method according to claim 1, further comprising forming a transparent conductive electrode layer over the p-type semiconducting layer.

16. The method according to claim 15, wherein the transparent conductive electrode layer comprises indium tin oxide.

17. A method of manufacturing a semiconducting device, comprising:
   forming a first polymer layer over a substrate, wherein the first polymer layer comprises (i) nitrogen and carbon or (ii) aromatic and aliphatic functional groups;
   forming a second polymer layer over the substrate, wherein the second polymer layer comprises asphalt or petroleum pitch;
   pyrolyzing one of the first or second polymer layers under substantially nonoxidizing conditions sufficient to transform the first or second polymer layer into a p-type semiconducting layer; and
   pyrolyzing the other polymer layer under substantially nonoxidizing conditions sufficient to transform the other polymer layer into an n-type semiconducting layer.

18. The method according to claim 17, wherein the first polymer layer comprises nitrogen and carbon.

19. The method according to claim 18, wherein pyrolysis to form a p-type semiconductor layer is conducted at a temperature about 400° C. to about 700° C.

20. The method according to claim 17, wherein pyrolysis to form an n-type semiconductor layer is conducted at a temperature about 700° C. to about 1000° C.

21. A method of manufacturing a semiconducting device, comprising:
   forming a first polymer layer over a substrate, wherein the first polymer layer comprises (i) nitrogen and carbon or (ii) aromatic and aliphatic functional groups;
   forming a second polymer layer over the substrate, wherein the second polymer layer comprises asphalt or petroleum pitch;
   pyrolyzing the first polymer layer under substantially nonoxidizing conditions;
   measuring to confirm that the first polymer layer is either is an n-type or p-type carrier;
   pyrolyzing the second polymer layer under substantially nonoxidizing conditions; and
   measuring to confirm that the second polymer layer is a carrier type that is different than the carrier type of the first polymer layer.

* * * * *